(12) United States Patent
Wu et al.

(10) Patent No.: US 10,700,080 B2
(45) Date of Patent: Jun. 30, 2020

(54) RANDOM BIT CELL WITH MEMORY UNITS

(71) Applicant: eMemory Technology Inc., Hsin-Chu (TW)

(72) Inventors: Chien-Han Wu, Hsinchu County (TW); Chun-Hung Lu, Hsinchu County (TW); Chun-Hung Lin, Hsinchu County (TW); Cheng-Da Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/513,740

(22) Filed: Jul. 17, 2019

(65) Prior Publication Data

US 2020/0090748 A1    Mar. 19, 2020

Related U.S. Application Data

(60) Provisional application No. 62/733,089, filed on Sep. 19, 2018.

(51) Int. Cl.
| | |
|---|---|
| *G11C 7/00* | (2006.01) |
| *H01L 27/11558* | (2017.01) |
| *H03K 3/012* | (2006.01) |
| *G11C 14/00* | (2006.01) |
| *H01L 29/10* | (2006.01) |
| *H01L 27/11524* | (2017.01) |
| *G11C 16/04* | (2006.01) |

(Continued)

(52) U.S. Cl.
CPC ......... *H01L 27/11558* (2013.01); *G11C 7/24* (2013.01); *G11C 11/165* (2013.01); *G11C 11/419* (2013.01); *G11C 13/0021* (2013.01); *G11C 14/0054* (2013.01); *G11C 16/0433* (2013.01); *G11C 16/10* (2013.01); *G11C 16/14* (2013.01); *G11C 16/26* (2013.01); *G11C 17/16* (2013.01); *H01L 27/11524* (2013.01); *H01L 29/1095* (2013.01); *H01L 29/4916* (2013.01); *H03K 3/012* (2013.01); *H03K 3/037* (2013.01); *H03K 19/018521* (2013.01); *H03K 19/20* (2013.01)

(58) Field of Classification Search
CPC ....... G11C 7/1078; G11C 7/22; G11C 7/1006; G11C 7/1072; G11C 7/1096
USPC ........................................ 365/189.16, 189.14
See application file for complete search history.

(56) References Cited

U.S. PATENT DOCUMENTS

| | | | |
|---|---|---|---|
| 10,276,239 B2 | 4/2019 | Lin | |
| 2011/0299317 A1* | 12/2011 | Shaeffer | G11C 13/0035 365/106 |

* cited by examiner

*Primary Examiner* — Son T Dinh
(74) *Attorney, Agent, or Firm* — Winston Hsu

(57) ABSTRACT

A random bit cell includes a random bit cell. The random bit cell includes a volatile memory unit, a first non-volatile memory unit, a second non-volatile memory unit, a first select transistor, and a second select transistor. The first non-volatile memory unit is coupled to a first data terminal of the volatile memory unit, and the second non-volatile memory unit is coupled to a second data terminal of the volatile memory unit. The first select transistor has a first terminal coupled to the first data terminal of the volatile memory unit, a second terminal coupled to a first bit line, and a control terminal coupled to a word line. The second select transistor has a first terminal coupled to the second data terminal of the volatile memory unit, a second terminal coupled to a second bit line, and a control terminal coupled to a word line.

20 Claims, 5 Drawing Sheets

(51) Int. Cl.
*G11C 16/14* (2006.01)
*G11C 16/26* (2006.01)
*G11C 16/10* (2006.01)
*H01L 29/49* (2006.01)
*H03K 19/0185* (2006.01)
*H03K 19/20* (2006.01)
*H03K 3/037* (2006.01)
*G11C 11/419* (2006.01)
*G11C 13/00* (2006.01)
*G11C 7/24* (2006.01)
*G11C 11/16* (2006.01)
*G11C 17/16* (2006.01)

RANDOM BIT CELL WITH MEMORY UNITS

CROSS REFERENCE TO RELATED APPLICATIONS

This non-provisional application claims priority of U.S. provisional application No. 62/733,089, filed on Sep. 19, 2018, included herein by reference in its entirety.

BACKGROUND OF THE INVENTION

1. Field of the Invention

The invention is related to a random bit cell, and more particular to a random bit cell capable of generating and storing a random bit.

2. Description of the Prior Art

As electronic devices are applied to more and more fields, information security between electronic devices and within electronic devices has raised great concerns. Since reverse engineering has become automatable on chips and devices, physical and side-channel attacks have become much more affordable and powerful. Therefore, it is more and more difficult to prevent the electronic devices from being accessed by unauthorized personnel.

In prior art, a physical unclonable function (PUF) circuit may be applied to generate random numbers as security keys for protecting the system from physical attacks due to its intrinsic characteristics. For example, the PUF circuit is usually formed with two elements having small and different characteristics due to the process variation, and the difference between the two elements will be magnified during an enroll operation so as to generate the random bit. However, according to the elements used by the PUF circuit and the degree of magnification during the enroll operation, the reading speed and reading accuracy can be different and difficult to be controlled.

SUMMARY OF THE INVENTION

One embodiment of the present invention discloses a random bit cell. The random bit cell includes a volatile memory unit, a first non-volatile memory unit, a second non-volatile memory unit, a first select transistor, and a second select transistor.

The volatile memory unit has a first data terminal and a second data terminal. The first non-volatile memory unit is coupled to the first data terminal of the volatile memory unit, and the second non-volatile memory unit is coupled to the second data terminal of the volatile memory unit. The first select transistor has a first terminal coupled to the first data terminal of the volatile memory unit, a second terminal coupled to a first bit line, and a control terminal coupled to a word line. The second select transistor has a first terminal coupled to the second data terminal of the volatile memory unit, a second terminal coupled to a second bit line, and a control terminal coupled to the word line.

During an enroll operation, one of the first non-volatile memory unit and the second non-volatile memory unit is be programmed. During a load operation after the enroll operation, the volatile memory unit stores a random bit according to programming states of the first non-volatile memory unit and the second non-volatile memory unit.

Another embodiment of the present invention discloses a method for operating a random bit cell. The random bit cell includes a volatile memory unit, a first non-volatile memory unit, and a second non-volatile memory unit. The volatile memory unit has a first data terminal and a second data terminal. The first non-volatile memory unit is coupled to the first data terminal of the volatile memory unit, and the second non-volatile memory unit is coupled to the second data terminal of the volatile memory unit.

The method includes performing an enroll operation to program one of the first non-volatile memory unit and the second non-volatile memory unit according to intrinsic characteristics of the first non-volatile memory unit and the second non-volatile memory unit, and performing a load operation after the enroll operation to store a random bit in the volatile memory unit according to programming states of the first non-volatile memory unit and the second non-volatile memory unit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
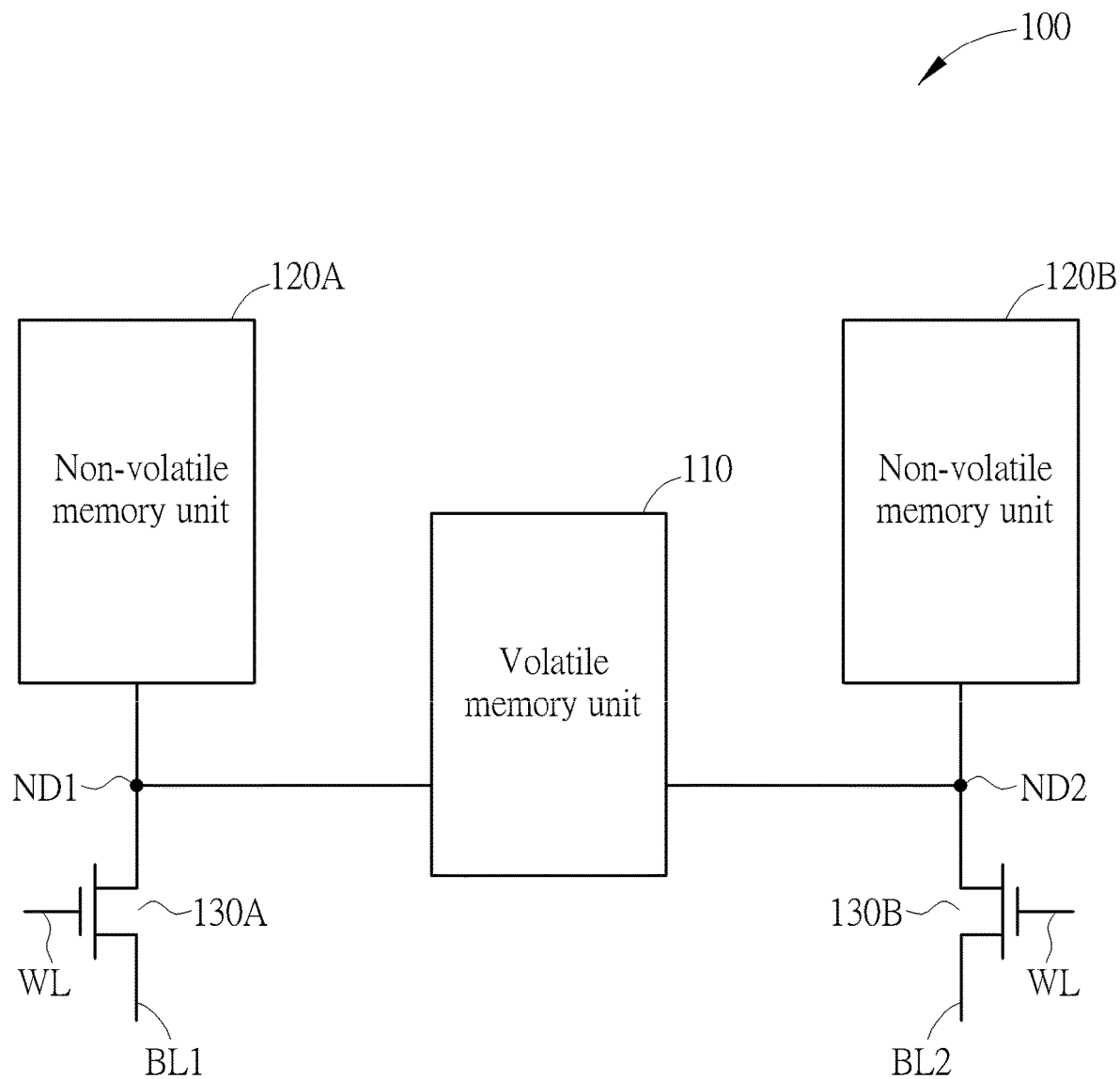
FIG. 1 shows a random bit cell according to one embodiment of the present invention.

FIG. 1 shows a random bit cell 100 according to one embodiment of the present invention. The random bit cell 100 includes a volatile memory unit 110, non-volatile memory units 120A and 120B, and select transistors 130A and 130B.

The volatile memory unit 110 has a first data terminal ND1 and a second data terminal ND2. The non-volatile memory unit 120A is coupled to the first data terminal ND1 of the volatile memory unit 110, and the non-volatile memory unit 120B is coupled to the second data terminal ND2 of the volatile memory unit 110.

The select transistor 130A has a first terminal coupled to the first data terminal ND1 of the volatile memory unit 110, a second terminal coupled to a bit line BL1, and a control terminal coupled to a word line WL, and the select transistor 130B has a first terminal coupled to the second data terminal ND2 of the volatile memory unit 110, a second terminal coupled to a bit line BL2, and a control terminal coupled to the word line WL.

In some embodiments, the random bit cell 100 can generate the random bit with the non-volatile memory units 120A and 120B, and store the random bit with the volatile memory unit 110.

Figure 2:
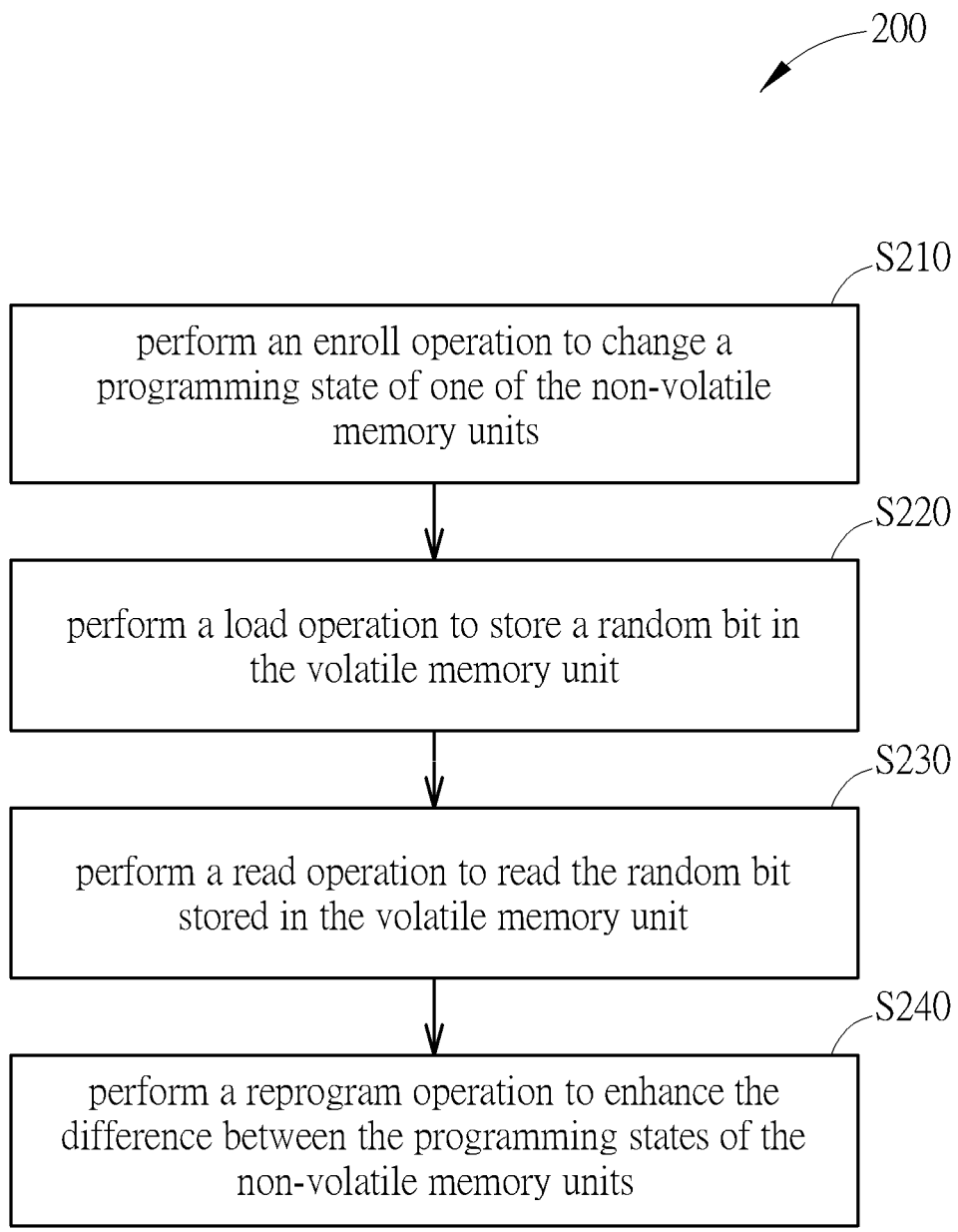
FIG. 2 shows a method for operating the random bit cell in FIG. 1 according to one embodiment of the present invention.

FIG. 2 shows a method 200 for operating the random bit cell 100 according to one embodiment of the present invention. The method 200 includes steps S210 to S240.

S210: perform an enroll operation to change a programming state of one of the non-volatile memory units 120A and 120B;

S220: perform a load operation to store a random bit in the volatile memory unit 110;

S230: perform a read operation to read the random bit stored in the volatile memory unit 110; and S240: perform a reprogram operation to enhance the difference between the programming states of the non-volatile memory units 120A and 120B.

During the enroll operation in step S210, the programming state of one of the non-volatile memory unit 120A and the non-volatile memory unit 120B will be changed according to the intrinsic characteristics of the non-volatile memory units 120A and 120B.

After the random bit cell 100 has been enrolled, the programming states can be used to represent the random bit of the random bit cell 100. In this case, the load operation can be performed in step S220 after the enroll operation. During the load operation, the random bit will be loaded and stored in the volatile memory unit 110.

Since the random bit can be loaded to the volatile memory unit 110, the random bit can be read from the volatile memory unit 110 when required. For example, during the read operation in step S230, the random bit stored in the volatile memory unit 110 can be read through the select transistors 130A and 130B and the bit lines BL1 and BL2. Since the read operation can be performed with the volatile memory unit 110, the reading speed and accuracy can be improved, and the reading control can be simplified.

In some embodiments, after the random bit is read, the reprogram operation can be performed in step S240 to further enhance the difference between the programming states of the non-volatile memory units 120A and 120B. That is, the difference between the programming states of the non-volatile memory units 120A and 120B can be further magnified so that the random bit can be loaded to the volatile memory unit 310 faster.

However, in some embodiments, if the difference between the programming states of the non-volatile memory units 120A and 120B is obvious enough, step S240 may be omitted. That is, the reprogram operation is optional, and can be performed only when needed.

Furthermore, in some other embodiments, after the random bit cell 100 provides the random bit for the system, the volatile memory unit 110 can also be used as a temporary storage space for the system. That is, the volatile memory unit 110 can be written with a predetermined data bit so the data can be used later by the system. Since the random bit is recorded by the programming states of the non-volatile memory units 120A and 120B, the random bit can still be accessed by performing the load operation and the read operation again later. That is, the random bit cell 100 can be used to provide the random bit, and can also be used as a regular storage space for the system.

In FIG. 1, the non-volatile memory units 120A and 120B can be magnetoresistive random access memory (MRAM) units or resistive random access memory (ReRAM) units. Also, the volatile memory unit 110 can be a static random access memory (SRAM) unit. However, in some other embodiments, the non-volatile memory units 120A and 120B, and the volatile memory unit 110 can be implemented with other types of memory units according to the system requirement.

Figure 3:
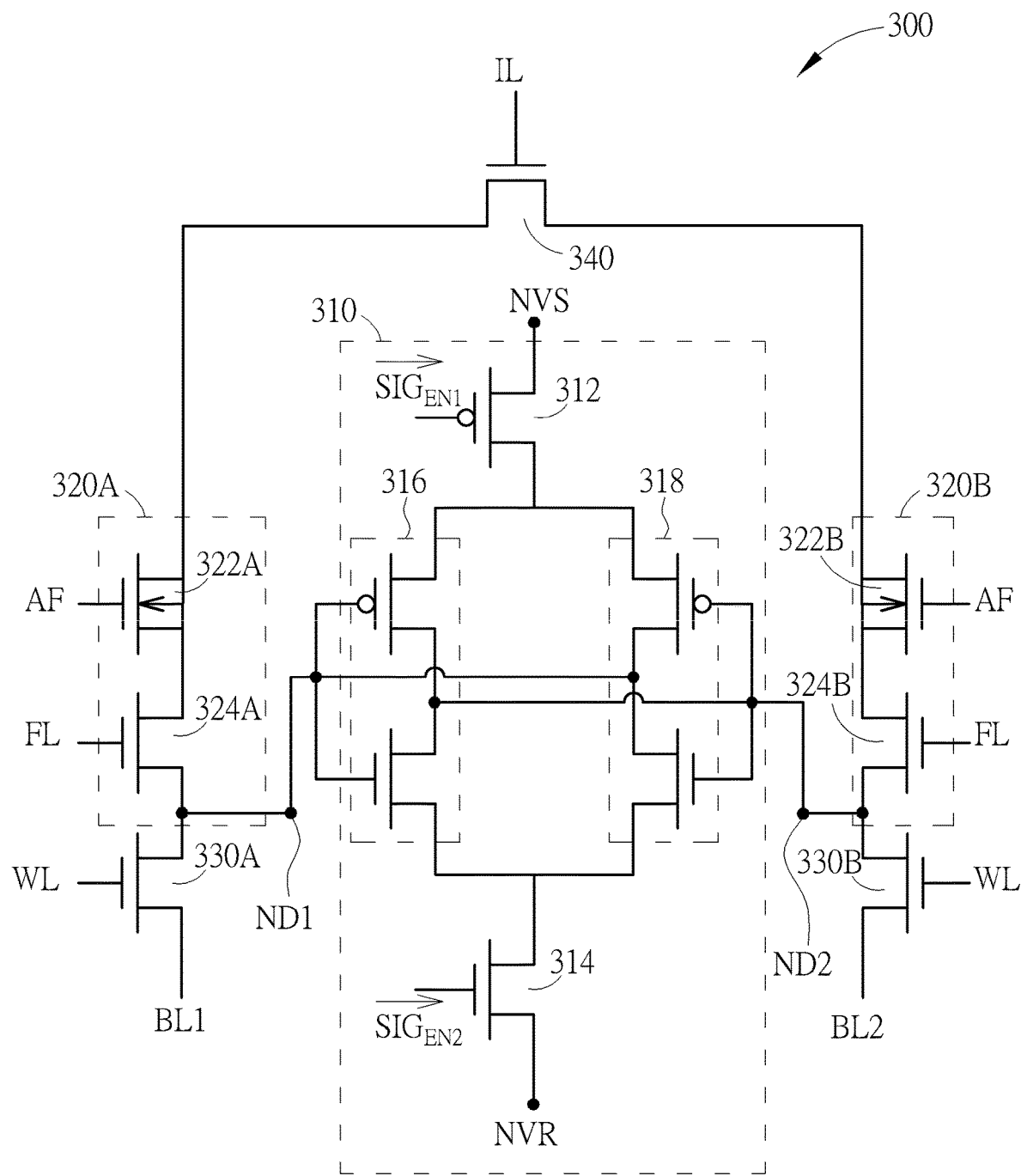
FIG. 3 shows a random bit cell according to another embodiment of the present invention.

FIG. 3 shows a random bit cell 300 according to another embodiment of the present invention. The random bit cell 300 and the random bit cell 100 have similar structures and can be operated with similar principles. The non-volatile memory units 320A and 320B can be implemented with anti-fuse varactors, and the volatile memory unit 310 can be implemented with a cross-coupled latch.

In FIG. 3, the non-volatile memory unit 320A includes an anti-fuse varactor 322A and a following gate transistor 324A. The anti-fuse varactor 322A has a first terminal, a second terminal, and a control terminal coupled to an anti-fuse control line AF. The following gate transistor 324A has a first terminal coupled to the second terminal of the anti-fuse varactor 322A, a second terminal coupled to the first data terminal ND1 of the volatile memory unit 310, and a control terminal coupled to a following gate line FL.

Also, the non-volatile memory unit 320B includes an anti-fuse varactor 322B and a following gate transistor 324B. The anti-fuse varactor 322B has a first terminal, a second terminal, and a control terminal coupled to the anti-fuse control line AF. The following gate transistor 324B has a first terminal coupled to the second terminal of the anti-fuse varactor 322B, a second terminal coupled to the second data terminal ND2 of the volatile memory unit 310, and a control terminal coupled to the following gate line FL.

In addition, the random bit cell 300 further includes an isolation transistor 340. The isolation transistor 340 has a first terminal coupled to the first terminal of the anti-fuse varactor 322A, a second terminal coupled to the first terminal of the anti-fuse varactor 322B, and a control terminal coupled to an isolation control line IL.

The volatile memory unit 310 includes enable transistors 312 and 314, and inverters 316 and 318. The enable transistor 312 has a first terminal coupled to a voltage source terminal NVS, a second terminal, and a control terminal for receiving an enable signal $SIG_{EN1}$. The inverter 316 has an input terminal coupled to the first data terminal ND1 of the volatile memory unit 310, an output terminal coupled to the second data terminal ND2 of the volatile memory unit 310, a first power terminal coupled to the second terminal of the enable transistor 312, and a second power terminal. The inverter 318 has an input terminal coupled to the second data terminal ND2 of the volatile memory unit 310, an output terminal coupled to the first data terminal ND1 of the volatile memory unit 310, a first power terminal coupled to the second terminal of the enable transistor 312, and a second power terminal. Also, the enable transistor 314 has a first terminal coupled to the second power terminals of the inverters 316 and 318, a second terminal coupled to a reference voltage terminal NVR, and a control terminal for receiving an enable signal $SIG_{EN2}$.

The method 200 can be used to operate the random bit cell 300 in some embodiments. For example, FIG. 4 shows the voltages received by the random bit cell 300 during the enroll operation performed in step S210 according to one embodiment of the present invention.

Figure 4:
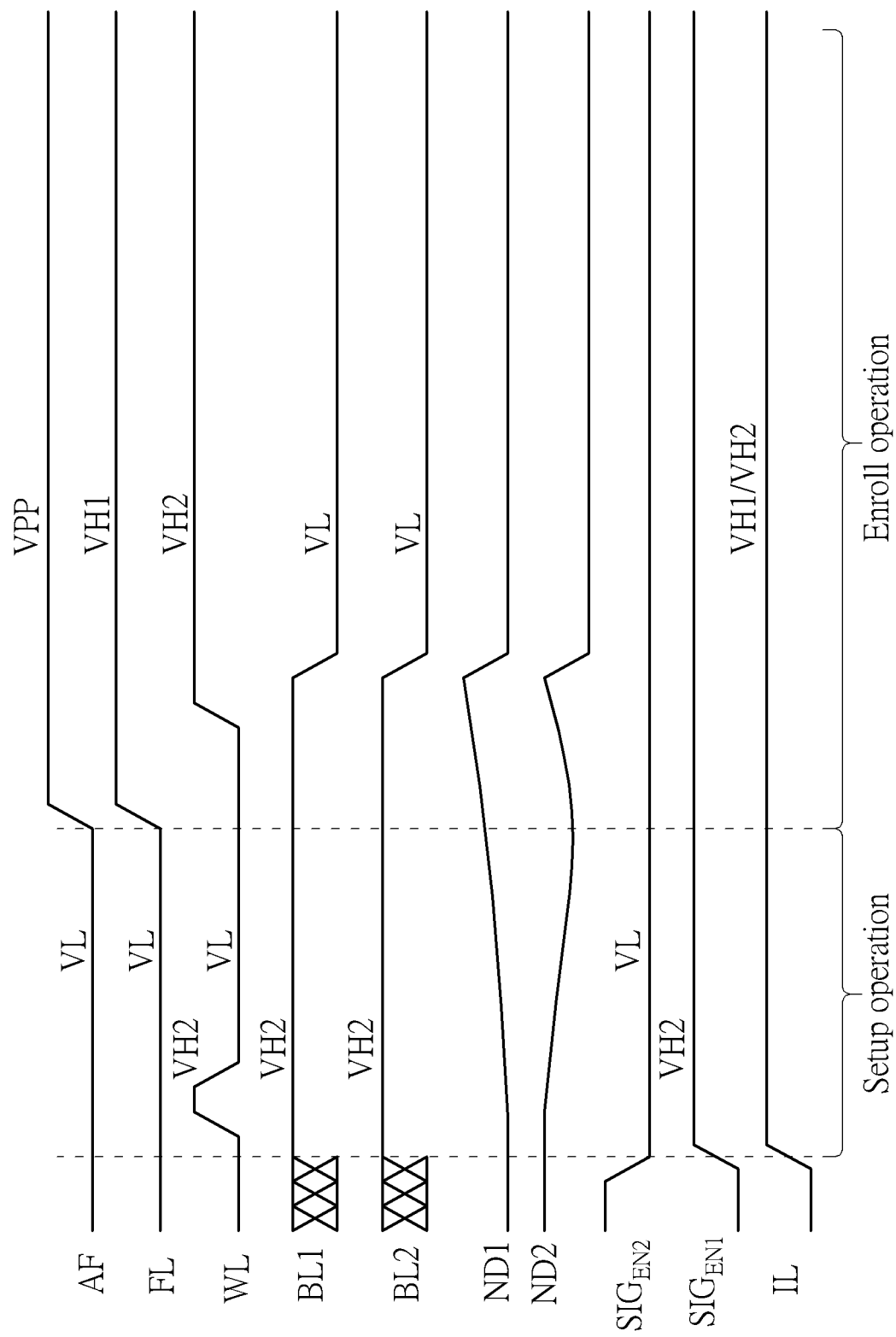
FIG. 4 shows the voltages received by the random bit cell in FIG. 3 during the enroll operation according to one embodiment of the present invention.

In FIG. 4, during the enroll operation, the anti-fuse control line AF can be at a program voltage VPP, the following gate line FL can be at a first operation voltage VH1, the word line WL can be at a second operation voltage VH2, the bit lines BL1 and BL2 can be at a reference voltage VL, and the isolation control line IL can be at the first operation voltage VH1 or the second operation voltage VH2. In addition, the volatile memory unit 310 can be disabled during the enroll operation. For example, the enable signal $SIG_{EN1}$ can be at the second operation voltage VH2 and the enable signal $SIG_{EN2}$ can be at the reference voltage VL to turn off the enable transistors 312 and 314.

In some embodiments, the program voltage VPP can be greater than the first operation voltage VH1, the first operation voltage VH1 can be greater than the second operation voltage VH2, and the second operation voltage VH2 can be greater than the reference voltage VL. For example, but not limited to, the program voltage VPP can be 6V, the first operation voltage VH1 can be 1.8V, the second operation voltage VH2 can be 1.4V, and the reference voltage VL can be 0V.

In this case, the select transistors 330A and 330B and the following gate transistors 324A and 324B can be turned on, and the second terminals of the anti-fuse varactors 322A and 322B can receive the reference voltage VL. Therefore, the great voltage applied on the anti-fuse varactors 322A and 322B may tend to rupture the anti-fuse varactors 322A and 322B. However, since the anti-fuse varactors 322A and 322B have different intrinsic characteristics, one of the anti-fuse varactors 322A and 322B may have a weaker structure and will be ruptured first. Once one of the anti-fuse varactors 322A and 322B is ruptured, the program voltage VPP will be transmitted to the first terminal of the other anti-fuse varactor through the ruptured structure and the isolation transistor 340, preventing the other anti-fuse varactor from being ruptured.

Consequently, after the enroll operation, one of the anti-fuse varactors 322A and 322B is ruptured, and the anti-fuse varactors 322A and 322B will have different programming states. In some embodiments, the programming states of the anti-fuse varactors 322A and 322B can be used to represent different random bits. For example, but not limited to, if the anti-fuse varactor 322A is programmed while the anti-fuse varactor 322B is not programmed, it may imply that the random bit is "1". Otherwise, if the anti-fuse varactor 322A is not programmed while the anti-fuse varactor 322B is programmed, it may imply that the random bit is "0".

In FIG. 4, before the enroll operation, a setup operation can be performed to ensure the non-volatile memory units 320A and 320B to be in the same condition before the enroll operation, thereby ensuring the randomness of the random bit generated by the random bit cell 300.

During the setup operation, the anti-fuse control line AF and the following gate line FL can be at the reference voltage VL, the word line WL can be set to the second operation voltage VH2 for a period of time and will be set to the reference voltage VL afterwards, the bit lines BL1 and BL2 can be at the second operation voltage VH2, and the isolation control line IL can be at the first operation voltage VH1 or the second operation voltage VH2.

In this case, the select transistors 330A and 330B will be turned on for a period of time to charge the second terminals of the following gate transistors 324A and 324B to the second operation voltage VH2. Consequently, the non-volatile memory units 320A and 320B will be in the same condition before the enroll operation.

In FIG. 4, during the enroll operation after the setup operation, the word line WL can be set to the second operation voltage VH2 after the anti-fuse control line AF is set to the program voltage VPP and the following gate line FL is set to the first operation voltage VH1. Also, the bit lines BL1 and BL2 can be set to the reference voltage VL simultaneously after the word line WL is set to the second operation voltage VH2. Therefore, the rupturing condition can be applied to the non-volatile memory units 320A and 320B simultaneously when the bit lines BL1 and BL2 are set to the reference voltage VL.

Figure 5:
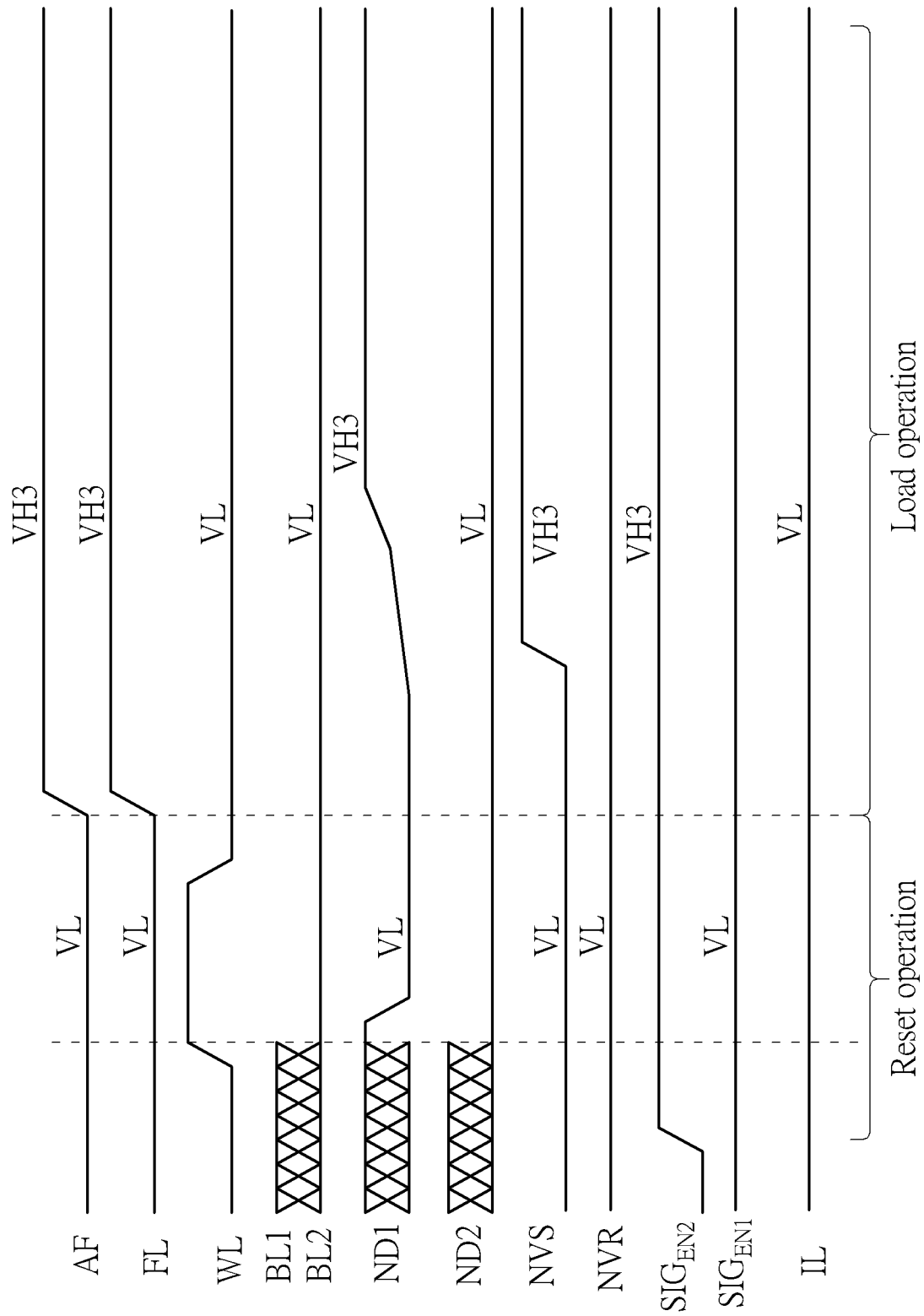
FIG. 5 shows the voltages received by the random bit cell in FIG. 3 during the load operation according to one embodiment of the present invention.

After the reset operation, the load operation in step S220 can be performed to load the random bit to the volatile memory unit 310. FIG. 5 shows the voltages received by the random bit cell 300 during the load operation performed in step S220 according to one embodiment of the present invention.

During the load operation after the reset operation, the anti-fuse control line AF and the following gate line FL can be at a third operation voltage VH3, the word line WL and the isolation control line IL can be at the reference voltage VL, and the volatile memory unit 310 can be enabled. In some embodiments, the enable transistors 312 and 314 can be turned on and the voltage source terminal NVS can provide the third operation voltage VH3 to enable the volatile memory unit 310.

In some embodiments, the third operation voltage VH3 can be greater than the reference voltage VL. For example, but not limited to, the third operation voltage VH3 can be 1V, and the reference voltage VL can be 0V.

In this case, if the anti-fuse varactor 322A is ruptured during the enroll operation, a significant leakage current will be generated and pass through the control terminal to the first terminal of the anti-fuse varactor 322A, raising the voltage at the first data terminal ND1 of the volatile memory unit 310. Consequently, the cross-coupled inverters 316 and 318 will latch the voltage of the first data terminal ND1 at the third operation voltage VH3 and latch the voltage of the second data terminal ND2 at the reference voltage VL. Therefore, the volatile memory unit 310 can store the random bit according to the programming states of the anti-fuse varactors 322A and 322B.

In FIG. 5, before the load operation, a reset operation can be performed to ensure the volatile memory unit 310 can store the random bit from the non-volatile memory units 320A and 320B without prejudice.

During the reset operation, the anti-fuse control line AF and the following gate line FL can be at the reference voltage VL, the word line WL can be set to the third operation voltage VH3 for a period of time and can be set to the reference voltage VL afterwards, and the bit lines BL1 and BL2 can be at the reference voltage VL. That is, during the reset operation before the load operation, the first data terminal ND1 and the second data terminal ND2 of the volatile memory unit 310 can be set to the reference voltage VL through the select transistors 330A and 330B and the bit lines BL1 and BL2.

Furthermore, in FIG. 5, during the load operation, the volatile memory unit 310 can be enabled after the anti-fuse control line AF and the following gate line FL are set to the third operation voltage VH3. Therefore, the voltages at the first data terminal ND1 and the second data terminal ND2 can be built first without being disturbed by the volatile memory unit 310.

In some embodiments, the enabling timing of the volatile memory unit 310 can be controlled by the voltage source terminal NVS. For example, in FIG. 5, the enable signals $SIG_{EN2}$ may be at the third operation voltage VH3 and $SIG_{EN1}$ can be at the reference voltage VL during the reset operation. However, the volatile memory unit 310 is enabled when the voltage source terminal NVS starts to provide the third operation voltage VH3 later in the load operation. By controlling the enable timing with the voltage source terminal NVS, the inverters 316 and 318 can start to latch the voltages at the data terminals ND1 and ND2 without prejudice.

After the volatile memory unit 310 loads the random bit from the non-volatile memory units 320A and 320B, step S230 can be performed to read the random bit from the volatile memory unit 310.

During the read operation, the anti-fuse control line AF, the following gate line FL, and the isolation control line IL can be at the reference voltage VL, the word line WL can be set to the third operation voltage VH3, and the volatile memory unit 310 can be enabled. In this case, the random bit can be outputted through the bit lines BL1 and BL2. In some embodiments, the random bit can be read by sensing the voltages on the bit lines BL1 and BL2 as a differential pair, thereby increasing the reading speed and accuracy.

In step S240, after the random bit has been read, the reprogram operation can be performed to enhance the difference between the programming states of the non-volatile memory units 320A and 320B. For example, if the non-volatile memory unit 320A is programmed and the non-volatile memory unit 320B is not programmed, the reprogram operation will be performed to further rupture the structure of anti-fuse varactor 322A of the non-volatile memory unit 320A. Therefore, the difference between the programming states of the non-volatile memory units 320A and 320B will be enhanced.

In this case, during the reprogram operation, the anti-fuse control line AF can be at the program voltage VPP, the following gate line FL can be at the first operation voltage VH1, the word line WL can be at the second operation voltage VH2, the bit line BL1 can be at the reference voltage VL, and the bit line BL2 can be at the second operation voltage VH2. Also, the isolation control line IL can be at the reference voltage VL, and the volatile memory unit 310 can be disabled. Consequently, the anti-fuse varactor 322A of the non-volatile memory unit 320A will be further ruptured by the great voltage while the anti-fuse varactor 322B of the non-volatile memory unit 320B will be inhibited from being programmed.

By performing the reprogram operation, the random bit can be loaded to the volatile memory unit 310 even faster next time during the load operation.

In addition, once the enroll operation is performed, the random bit will be recorded by the structure changes of the anti-fuse varactors 322A and 322B. Since the random bit can be loaded from the non-volatile memory units 320A and 320B to the volatile memory unit 310 whenever required, the volatile memory unit 310 can still be used as a regular storage space for storing system data.

For example, the volatile memory unit 310 can be written with a predetermined data bit requested by the system. The write operation can be performed by applying voltages similar to the voltages used in the enroll operation as shown in FIG. 4, however, the difference between these two operation is in that the bit lines BL1 and BL2 are set to the reference voltage VL and the second operation voltage VH2 according to the bit to be written. For example, when a first type of data, for example but not limited to "0", is to be written to the volatile memory unit 310, the bit line BL1 can be at the reference voltage VL and the bit line BL2 can be at the second operation voltage VH2. However, if a second type of data, for example but not limited to "1", is to be written to the volatile memory unit 310, the bit line BL1 can be at the second operation voltage VH2 and the bit line BL2 can be at the reference voltage VL.

In summary, the random bit cell and the method for operating the random bit cell provided by the embodiments of the present invention can enroll the random bit with the non-volatile memory units, and can load the random bit from the non-volatile memory units to the volatile memory unit for fast reading. Also, since the random bit can be recorded with the non-volatile memory units, the volatile memory unit can also be used to store other types of data according to the system requirement and can load the random bit from the non-volatile memory units when needed, allowing the system to have a more flexible usage of memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random bit cell comprising:
 a volatile memory unit having a first data terminal and a second data terminal;
 a first non-volatile memory unit coupled to the first data terminal of the volatile memory unit;
 a second non-volatile memory unit coupled to the second data terminal of the volatile memory unit;
 a first select transistor having a first terminal coupled to the first data terminal of the volatile memory unit, a second terminal coupled to a first bit line, and a control terminal coupled to a word line; and
 a second select transistor having a first terminal coupled to the second data terminal of the volatile memory unit, a second terminal coupled to a second bit line, and a control terminal coupled to the word line;
 wherein:
 during an enroll operation, a programming state of one of the first non-volatile memory unit and the second non-volatile memory unit is changed; and
 during a load operation after the enroll operation, the volatile memory unit is configured to store a random bit according to programming states of the first non-volatile memory unit and the second non-volatile memory unit.

2. The random bit cell of claim 1, wherein:
 the first non-volatile memory unit comprises:
 a first anti-fuse varactor having a first terminal, a second terminal, and a control terminal coupled to an anti-fuse control line; and
 a first following gate transistor having a first terminal coupled to the second terminal of the first anti-fuse varactor, a second terminal coupled to the first data terminal of the volatile memory unit, and a control terminal coupled to a following gate line; and
 the second non-volatile memory unit comprises:
 a second anti-fuse varactor having a first terminal, a second terminal, and a control terminal coupled to the anti-fuse control line; and
 a second following gate transistor having a first terminal coupled to the second terminal of the second anti-fuse varactor, a second terminal coupled to the second data terminal of the volatile memory unit, and a control terminal coupled to the following gate line.

3. The random bit cell of claim 2, further comprising an isolation transistor having a first terminal coupled to the first terminal of the first anti-fuse varactor, a second terminal coupled to the first terminal of the second anti-fuse varactor, and a control terminal coupled to an isolation control line.

4. The random bit cell of claim 3, wherein during the enroll operation:
 the anti-fuse control line is at a program voltage (VPP);
 the following gate line is at a first operation voltage (VH1);
 the word line is at a second operation voltage (VH2);
 the first bit line and the second bit line are at a reference voltage (VL);

the isolation control line is at the program voltage; and
the volatile memory unit is disabled;
wherein the program voltage is greater than the first operation voltage, the first operation voltage is greater than the second operation voltage, and the second operation voltage is greater than the reference voltage.

5. The random bit cell of claim 4, wherein during the enroll operation:
the word line is set to the second operation voltage after the anti-fuse control line is set to the program voltage and the following gate line is set to the first operation voltage; and
the first bit line and the second bit line are set to the reference voltage simultaneously after the word line is set to the second operation voltage.

6. The random bit cell of claim 5, wherein during a setup operation before the enroll operation:
the anti-fuse control line and the following gate line are at the reference voltage;
the word line is set to the second operation voltage for a period of time and is set to the reference voltage afterwards;
the first bit line and the second bit line are at the second operation voltage; and
the isolation control line is at the program voltage.

7. The random bit cell of claim 3, wherein during the load operation after the enroll operation:
the anti-fuse control line and the following gate line are at a third operation voltage (VH3);
the word line and the isolation control line are at a reference voltage (VL); and
the volatile memory unit is enabled;
wherein the third operation voltage is greater than the reference voltage.

8. The random bit cell of claim 7, wherein during the load operation:
the volatile memory unit is enabled after the anti-fuse control line and the following gate line are set to the third operation voltage.

9. The random bit cell of claim 7, wherein during a reset operation before the load operation:
the anti-fuse control line and the following gate line are at the reference voltage;
the word line is set to the third operation voltage for a period of time and is set to the reference voltage afterwards; and
the first bit line and the second bit line are at the reference voltage.

10. The random bit cell of claim 3, wherein during a read operation after the load operation:
the anti-fuse control line, the following gate line, and the isolation control line are at the reference voltage;
the word line is set to an operation voltage greater than the reference voltage; and
the volatile memory unit is enabled to output the random bit.

11. The random bit cell of claim 3, wherein during a reprogram operation after the load operation:
the anti-fuse control line is at a program voltage;
the following gate line is at a first operation voltage;
the word line is at a second operation voltage;
the first bit line is at a reference voltage and the second bit line is at the second operation voltage when the first non-volatile memory unit is programmed and the second non-volatile memory unit is not programmed;
the isolation control line is at the reference voltage; and
the volatile memory unit is disabled;
wherein the program voltage is greater than the first operation voltage, the first operation voltage is greater than the second operation voltage, and the second operation voltage is greater than the reference voltage.

12. The random bit cell of claim 3, wherein during a write operation:
the anti-fuse control line, the following gate line, and the isolation control line are at a reference voltage;
the word line is set to an operation voltage greater than the reference voltage;
the first bit line is at a reference voltage and the second bit line is at the second operation voltage when a first type of data is to be written; and
the volatile memory unit is enabled.

13. The random bit cell of claim 1, wherein the volatile memory unit comprises:
a first enable transistor having a first terminal coupled to a voltage source terminal, a second terminal, and a control terminal configured to receive a first enable signal;
a first inverter having an input terminal coupled to the first data terminal of the volatile memory unit, an output terminal coupled to the second data terminal of the volatile memory unit, a first power terminal coupled to the second terminal of the first enable transistor, and a second power terminal;
a second inverter having an input terminal coupled to the second data terminal of the volatile memory unit, an output terminal coupled to the first data terminal of the volatile memory unit, a first power terminal coupled to the second terminal of the first enable transistor, and a second power terminal; and
a second enable transistor having a first terminal coupled to the second power terminal of the first inverter and the second power terminal of the second inverter, a second terminal coupled to a reference voltage terminal, and a control terminal configured to receive a second enable signal.

14. The random bit cell of claim 13, wherein:
the first enable transistor and the second enable transistor are configured to be turned on to enable the volatile memory unit; and
the voltage source terminal is configured to provide a third operation voltage to enable the volatile memory unit.

15. The random bit cell of claim 1, wherein:
the first non-volatile memory unit and the second non-volatile memory unit are magnetoresistive random access memory (MRAM) units or resistive random access memory (ReRAM) units.

16. The random bit cell of claim 1, wherein:
the volatile memory unit is a static random access memory (SRAM) unit.

17. A method for operating a random bit cell, the random bit cell comprising a volatile memory unit, a first non-volatile memory unit, and a second non-volatile memory unit, the volatile memory unit having a first data terminal and a second data terminal, the first non-volatile memory unit being coupled to the first data terminal of the volatile memory unit, the second non-volatile memory unit being coupled to the second data terminal of the volatile memory unit, and the method comprising:
performing an enroll operation to change a programming state of one of the first non-volatile memory unit and the second non-volatile memory unit according to intrinsic characteristics of the first non-volatile memory unit and the second non-volatile memory unit; and performing a load operation after the enroll operation to store a random bit in the volatile memory unit according to programming states of the first non-volatile memory unit and the second non-volatile memory unit.

18. The method of claim 17 further comprising:
performing a read operation after the load operation to read the random bit stored in the volatile memory unit.

19. The method of claim 18 further comprising:
performing a reprogram operation after the read operation to enhance difference between the programming states of the first non-volatile memory unit and the second non-volatile memory unit.

20. The method of claim 18 further comprising:
performing a write operation to store a predetermined bit to the volatile memory unit.

* * * * *